United States Patent
Jin et al.

(10) Patent No.: US 11,092,359 B2
(45) Date of Patent: Aug. 17, 2021

(54) PHOTOVOLTAIC-PHOTOTHERMAL REACTION COMPLEMENTARY FULL-SPECTRUM SOLAR UTILIZATION SYSTEM

(71) Applicant: INSTITUTE OF ENGINEERING THERMOPHYSICS, CHINESE ACADEMY OF SCIENCES, Beijing (CN)

(72) Inventors: Hongguang Jin, Beijing (CN); Hui Hong, Beijing (CN); Yong Hao, Beijing (CN); Jie Sun, Beijing (CN); Yawen Zhao, Beijing (CN); Wenjia Li, Beijing (CN); Qibin Liu, Beijing (CN)

(73) Assignee: Institute of Engineering Thermophysics, Chinese Academy of Sciences, Beijing (CN)

( * ) Notice: Subject to any disclaimer, the term of this patent is extended or adjusted under 35 U.S.C. 154(b) by 284 days.

(21) Appl. No.: 15/549,367

(22) PCT Filed: Feb. 6, 2016

(86) PCT No.: PCT/CN2016/073719
§ 371 (c)(1),
(2) Date: Aug. 7, 2017

(87) PCT Pub. No.: WO2016/127934
PCT Pub. Date: Aug. 18, 2016

(65) Prior Publication Data
US 2018/0041158 A1 Feb. 8, 2018

(30) Foreign Application Priority Data

Feb. 15, 2015 (CN) .......................... 201510082532.9
Sep. 16, 2015 (CN) .......................... 201510590542.3

(51) Int. Cl.
*H02S 40/44* (2014.01)
*H02S 40/22* (2014.01)
(Continued)

(52) U.S. Cl.
CPC ................. *F24S 23/00* (2018.05); *B01J 8/00* (2013.01); *H01L 31/0547* (2014.12);
(Continued)

(58) Field of Classification Search
None
See application file for complete search history.

(56) References Cited

U.S. PATENT DOCUMENTS 5,059,254 A * 10/1991 Yaba ................. B32B 17/10018
136/244
2011/0214712 A1  9/2011 Frazier
2012/0325290 A1* 12/2012 Gizara ...................... F03G 6/00
136/248

FOREIGN PATENT DOCUMENTS

CN       102956725 A       3/2013
CN       103296739 A       9/2013
(Continued)

OTHER PUBLICATIONS

International Search Report and Written Opinion, dated May 13, 2016, in International Patent Application No. PCT/CN2016/073719, 10 pages.

*Primary Examiner* — Dustin Q Dam
(74) *Attorney, Agent, or Firm* — Davis Wright Tremaine LLP; Michael J. Donohue

(57) ABSTRACT

The present disclosure provides a photovoltaic-photothermal reaction complementary full-spectrum solar utilization system, comprising:
a waveband thermal reactor having a reactant flow channel and a reaction chamber therein,
(Continued)

a photovoltaic cell attached to a surface of the waveband thermal reactor, and a full spectrum concentrator configured to concentrate full spectrum sunlight onto a surface of the photovoltaic cell, wherein the full spectrum concentrating device concentrates the full spectrum sunlight onto a upper surface of the opaque or transmissive photovoltaic cell, wherein a portion of the sunlight is converted into electric energy and another portion of the sunlight is converted into thermal energy, and wherein the thermal energy is utilized by the waveband thermal reactor to preheat reactant(s) in the reaction chamber and to make a portion of the reactant(s) to undergo an endothermic chemical reaction such that the thermal energy is stored as chemical energy.

13 Claims, 3 Drawing Sheets

(51) Int. Cl.
| | |
|---|---|
| *F24S 23/00* | (2018.01) |
| *B01J 8/00* | (2006.01) |
| *H02S 10/10* | (2014.01) |
| *H01L 31/054* | (2014.01) |
| *H02S 10/20* | (2014.01) |
| *H02S 10/30* | (2014.01) |
| *F24S 21/00* | (2018.01) |
| *F24S 50/20* | (2018.01) |

(52) U.S. Cl.
CPC .............. *H02S 10/10* (2014.12); *H02S 10/20* (2014.12); *H02S 10/30* (2014.12); *H02S 40/22* (2014.12); *H02S 40/44* (2014.12); *F24S 21/00* (2018.05); *F24S 50/20* (2018.05); *Y02E 10/52* (2013.01); *Y02E 10/60* (2013.01)

(56) References Cited

FOREIGN PATENT DOCUMENTS

| CN | 104676911 A | 6/2015 |
|---|---|---|
| CN | 105227133 A | 1/2016 |

\* cited by examiner

PHOTOVOLTAIC-PHOTOTHERMAL REACTION COMPLEMENTARY FULL-SPECTRUM SOLAR UTILIZATION SYSTEM

CROSS-REFERENCE TO RELATED APPLICATIONS

This application is a National Stage Application of International Application No. PCT/CN2016/073719, filed on Feb. 6, 2016 and entitled "Photovoltaic-Photothermal Reaction Complementary Full-Spectrum Solar Utilization System", claims priority to Chinese Application No. 201510082532.9, filed on Feb. 15, 2015 and entitled "Photovoltaic and Photo-Thermal Chemical Combination Solar Energy Comprehensive Utilization Device and System" as well as Chinese Application No. 201510590542.3, filed on Sep. 16, 2015 and entitled "Linear Fresnel Transmitting Photovoltaic Photo-Thermal Composite Utilization Device", the contents of which are incorporated herein by reference in their entirety.

BACKGROUND OF THE DISCLOSURE

Field of the Disclosure

The disclosure relates to a field of new energy (renewable energy) technology, and in particular to a photovoltaic-photothermal reaction complementary full-spectrum solar utilization system.

Description of the Related Art

In a solar photovoltaic utilization technology, a portion of solar energy in certain wavebands is converted into electricity by means of photovoltaic effect of solar photovoltaic cell with the remaining solar energy being not effectively used. The power generation efficiency of current mass-produced solar photovoltaic cells is about 15%-25%, which means that more than 75% of the sunlight cannot be used and the full spectrum utilization efficiency of solar energy is low. Also, since large-scale electricity storage technology is far from mature, the solar photovoltaic utilization technology can only be used under sunlight, but is unable to supply power in a stand-alone, stable and all-weather manner.

In the solar photothermal power generation technology, solar energy is firstly converted into thermal energy and then converted into electric energy. In particular, the sunlight is concentrated to a geometric focus by a regular curved surface (such as parabolic mirror) so as to obtain a high temperature, and then converted into electric energy by heat engines or thermoelectric generators. In this technology, since the heat collection process directly converts high energy-level full spectrum solar energy into low energy-level thermal energy, and since that power generation efficiency of thermal energy is constrained by Carnot efficiency, and there are many other factors such as intermediate steps, the full spectrum utilization efficiency of solar energy is low.

In the solar photovoltaic-photothermal combined power generation technology, a portion of the solar energy is utilized by photovoltaic cells, and another portion of the solar energy is utilized in the form of heat to generate electricity. At present, there are two main ways to implement this technology. One of the two main ways is called as "thermal coupling" mode. In the "thermal coupling" mode, all the sunlight is firstly projected to the photovoltaic cell. The full spectrum solar energy is partially converted into electric energy and the rest is converted into low energy-level waveband thermal energy. The thermal energy is then converted into electric energy by heat engine or thermoelectric material. The other way is called the "thermal decoupling" mode. In the "thermal decoupling" mode, according to responsive characteristics of the photovoltaic cells and the photothermal utilization to the spectrum, the entire solar spectrum is divided into two wavelength ranges by a frequency splitter. Solar energy in certain wavebands is utilized by the photovoltaic cells such that a portion of the solar energy in certain wavebands is converted into electric energy and such that another portion is converted into thermal energy. Solar energy in remaining wavebands is converted into the thermal energy which can also be converted into electric energy by heat engines or thermoelectric generators.

In the process of implementing the present disclosure, the applicants have found that the above prior art has the following problems in converting solar energy into electric energy, respectively:

(1) the mass-produced photovoltaic cells can only convert a portion of short-wave solar energy into electric energy, and the rest of the short-wave solar energy and long-wave solar energy is not used such that the full spectrum utilization efficiency is low;

(2) as the usage of the solar photovoltaic power generation system is limited during daytime, power supply stability of the system is poor, and large-scale electricity storage technology associated with photovoltaic power generation is far from mature, thus single photovoltaic power generation is difficult to meet the requirements for a stable power supply or supplying power at night;

(3) with the photothermal technology, in the process of light-to-heat conversion, the full spectrum solar energy is directly converted into low energy-level thermal energy such that in this process loss of the available energy (i.e. maximum useful work extractable from the total energy) is large, resulting in a low utilization efficiency of full spectrum solar energy;

(4) in the solar photovoltaic-photothermal technology using a frequency splitter, although a cascaded utilization for the short-wavelength and long-wavelength solar energy is achieved by the frequency splitter, the frequency splitter increases the optical loss of the system at the same time. Production of the frequency splitter is currently difficult and costly.

SUMMARY OF THE DISCLOSURE

The photovoltaic-photothermal reaction complementary full-spectrum solar utilization system according to the present disclosure includes:

a waveband thermal reactor having a reactant flow channel and a reaction chamber therein, a photovoltaic cell attached to a surface of the waveband thermal reactor, and a full spectrum concentrating device configured to concentrate full spectrum sunlight to a surface of the photovoltaic cell, wherein the full spectrum concentrating device concentrates the full spectrum sunlight to an upper surface of the photovoltaic cell, wherein a portion of the sunlight is converted into electric energy and another portion of the sunlight is converted into thermal energy, and wherein the thermal energy is utilized by the waveband thermal reactor to preheat reactants in the reaction chamber and to cause a portion of the reactant(s) to undergo an endothermic chemical reaction such that the thermal energy is stored as chemical energy.

Figure 1:
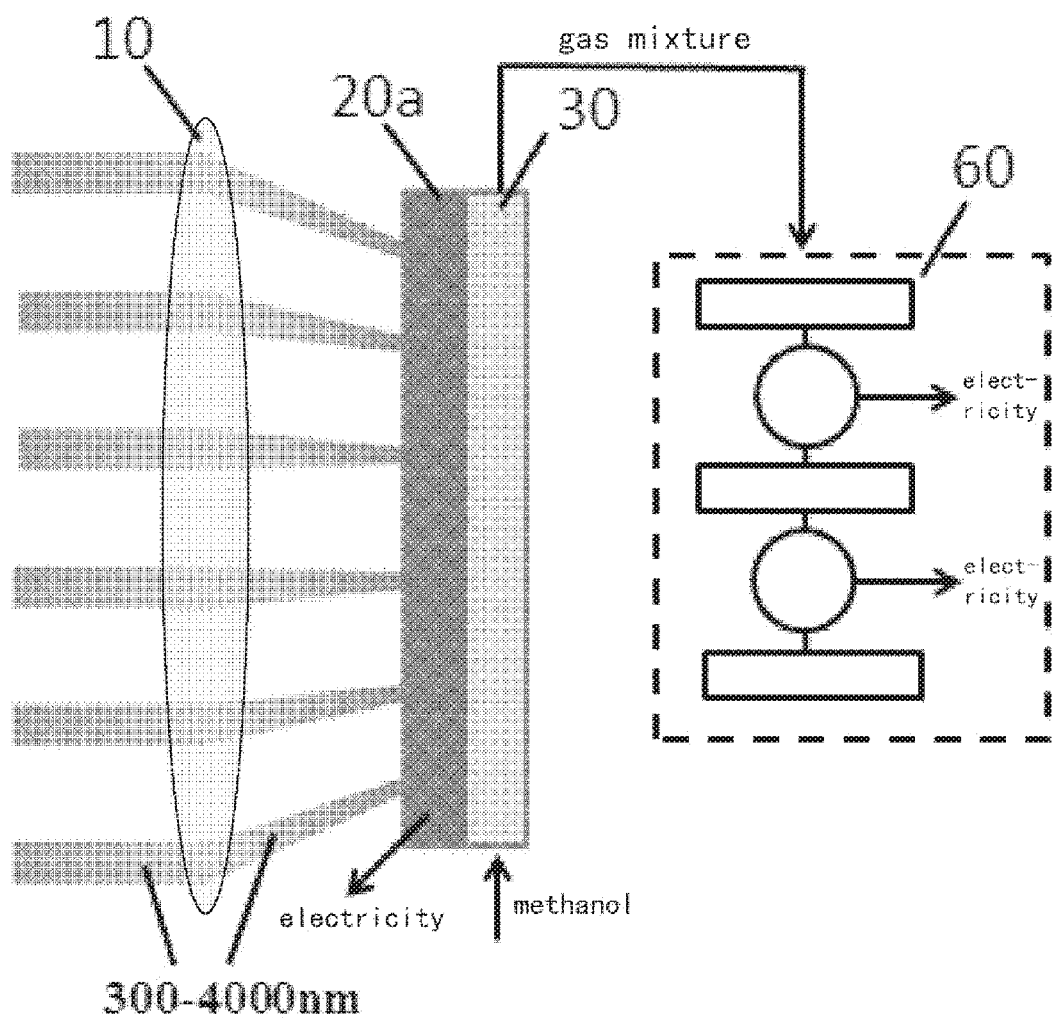
FIG. 1 is a structural schematic view of a photovoltaic-photothermal reaction complementary full-spectrum solar utilization system based on opaque photovoltaic cell according to a first embodiment of the present invention.

NUMERAL SIGNS 10 full spectrum concentrating device
20a opaque photovoltaic cell
20b transmissive photovoltaic cell
30 waveband thermal reactor
40 waveband photothermal reactor
50 reflective film
60 gas-steam combined cycle power generation system

DETAILED DESCRIPTION OF EMBODIMENTS OF THE DISCLOSURE

The present disclosure provides a photovoltaic-photothermal reaction complementary full-spectrum solar utilization system so as to improve the utilization efficiency and practicability of solar energy.

The photovoltaic-photothermal reaction complementary full-spectrum solar utilization system according to the present disclosure has the following advantageous effects:

(1) When the photovoltaic cell is opaque, a portion of the short-wavelength solar energy is converted into electric energy, and the rest of the short-wavelength and long-wavelength solar energy are converted into waveband residual heat. The residual heat is absorbed during the chemical reaction and converted into high energy-level chemical energy, Compared with a case in which the waveband residual heat is utilized by heat engine or thermoelectric material, the full-spectrum solar utilization efficiency of the system is higher.

(2) When the photovoltaic cell is partially transmissive, the solar energy is concentrated to the surface of the photovoltaic cell by the full spectrum concentrating device. The transmissive photovoltaic cell absorbs the short-wavelength solar energy (such as 300 to 1000 nm) and converts a portion of the short-wavelength solar energy into electric energy. The short-wavelength solar energy that is not converted into electric energy is absorbed by the reactants and finally converted into chemical energy. The long-wavelength solar energy (such as 1000 to 4000 nm) is transmitted through the photovoltaic cell and continues to be transmitted in the form of light. Then, a light-to-heat-to-fuel chemical energy conversion is achieved in the photothermal reactor. This system can convert the low energy-level waveband residual heat and the long-wavelength solar energy into the high energy-level chemical energy while ensuring the high operating efficiency of the photovoltaic cell at low temperature without the use of a frequency splitter, achieving a step utilization of full spectrum solar energy.

(3) The efficiency of this system is higher by et least 8 percentage points than that of the single photovoltaic cell system.

The disclosure mainly relates to the utilization of full spectrum solar energy. With the photovoltaic-photothermal-thermochemical comprehensive complementary method, the solar energy is firstly utilized by the photovoltaic cell to generate electric energy. The waveband residual heat from the photovoltaic cell and the solar energy transmitted through the photovoltaic cell is absorbed by an endothermic chemical reaction and converted into a high energy-level chemical energy (fuel), thereby greatly improving the utilization efficiency of solar energy.

The disclosure will be described below in connection with particular embodiments and with reference to the accompanying drawings so as to clarify the purpose, technical solution and advantages of the present application.

Example One: Photovoltaic-Photothermal Reaction Complementary Full-Spectrum Solar Utilization System The first exemplary embodiment of the present invention provides a photovoltaic-photothermal reaction complementary full-spectrum solar utilization system based on opaque photovoltaic cell.

FIG. 1 is a structural schematic of a photovoltaic-photothermal reaction complementary full-spectrum solar utilization system based on an opaque photovoltaic cell according to the first embodiment of the present invention. As shown in FIG. 1, the full-spectrum solar utilization system in the present embodiment includes a full spectrum concentrating device 10, an opaque photovoltaic cell 20a, a waveband thermal reactor 30, and a gas-steam combined cycle power generation system 60.

In this embodiment, the reactant is methanol, and the endothermic chemical reaction is a methanol decomposition reaction. The full spectrum concentrating device 10 concentrates the full spectrum sunlight to an upper surface of the photovoltaic cell 20a. The full spectrum sunlight is absorbed by the photovoltaic cell 20a. A portion of the sunlight is converted into electric energy and the rest of the sunlight is converted into thermal energy. The thermal energy is utilized by the waveband thermal reactor 30 to preheat methanol and carry out decomposition of methanol. The gas mixture resulting from the decomposition reaction serves as combustion fuel for the gas-steam combined cycle power generation system 60 to generate electricity.

The respective components of the full-spectrum solar utilization system in the present embodiment will be described in detail below.

It should be noted that although the methanol decomposition reaction is employed in the present embodiment as a reaction that converts the solar energy into chemical energy, in fact, an endothermic chemical reaction between other fluids or between fluid and solid, such as dimethyl ether decomposition, methanol water steam reforming, dimethyl ether water steam reforming, ethanol water steam reforming, methane water steam reforming, methane carbon dioxide reforming, water decomposition, and carbon dioxide decomposition, can be applied to the full-spectrum solar utilization system of the disclosure. For example, (1) the reactant is methanol, and the endothermic chemical reaction is a methanol decomposition reaction;

(2) the reactant is dimethyl ether, and the endothermic chemical reaction is a dimethyl ether decomposition reaction;

(3) the reactants are methanol and steam, and the endothermic chemical reaction is a methanol water steam reforming reaction;

(4) the reactants are dimethyl ether and steam, and the endothermic chemical reaction is a dimethyl ether water steam reforming reaction;

(5) the reactants are ethanol and steam, and the endothermic chemical reaction is an ethanol water steam reforming reaction;

(6) the reactants are methane and steam, and the endothermic chemical reaction is a methane steam water reforming reaction;

(7) the reactants are methane and carbon dioxide, and the endothermic chemical reaction is a methane carbon dioxide reforming reaction;

(8) the reactant is steam, and the endothermic reaction is a water decomposition reaction;

(9) the reactant is carbon dioxide, and the endothermic reaction is a carbon dioxide decomposition reaction.

A methanol flow channel and a reaction chamber are provided inside the waveband thermal reactor 30, and methanol is inputted through an inlet of the methanol flow channel. Further, the photovoltaic cell 20a is an opaque photovoltaic cell. A lower surface of the photovoltaic cell 20a is attached to an upper surface of the waveband thermal reactor 30 such that they are brought into close contact to intensify heat exchange and such that methanol decomposition reaction takes place in the reaction chamber by the aid of the heat generated by the sunlight that is not converted into electric energy.

The full spectrum concentrating device 10 concentrates the full spectrum sunlight to the upper surface of the photovoltaic cell 20a. The present disclosure is not intended to be limited to a specific type of full spectrum concentrating device. It can be understood that all of the presently known full spectrum concentrating devices can be used in the system, including but not limited to, a trough solar concentrating device, a Fresnel solar concentrating device, a compound parabolic solar concentrating device, a tower solar concentrating device, or a disc solar concentrating device.

In this embodiment, the product obtained after the methanol decomposition reaction is directly used as the fuel of the gas-steam combined cycle power generation system 60. In fact, the methanol can be separated and purified after the decomposition reaction to obtain methanol recovered from the gas mixture. Then the recovered methanol is used as the fuel of the gas-steam combined cycle power generation system 60. The gas-steam combined cycle power generation system 60 may also include a fuel storage device such that when the sunlight is sufficient, the gas-steam combined cycle power generation system 60 may store a portion of the decomposition product that can be used for combustion and power generation when the sunlight is insufficient or when there is no sunlight, realizing a stable and all-weather power supply capability. The gas-steam combined cycle power generation system 60 is a power plant well known in the art, and will not be described in detail herein.

It should be noted that in the present embodiment, the gas-steam combined cycle power generation system is selected as a consumer of the chemical reaction product. The use of the product includes but is not limited to, the fuel of other power generation system (such as an internal combustion engine power generation system, a fuel cell power generation system), raw material for chemical processes, industrial fuel, domestic fuel, raw materials for medical purposes.

It can be seen from the above description that, while the solar energy is converted into electric energy by virtue of the photovoltaic-photothermal reaction complementary full-spectrum solar utilization system based on opaque photovoltaic cell according to the present embodiment, the waveband residual heat generated by the unconverted solar energy is absorbed by the chemical reaction and converted into high energy-level chemical energy. Compared with a case in which the residual heat is utilized by heat engines or thermoelectric generators, more benefits are obtained and the utilization efficiency is higher.

Figure 2:
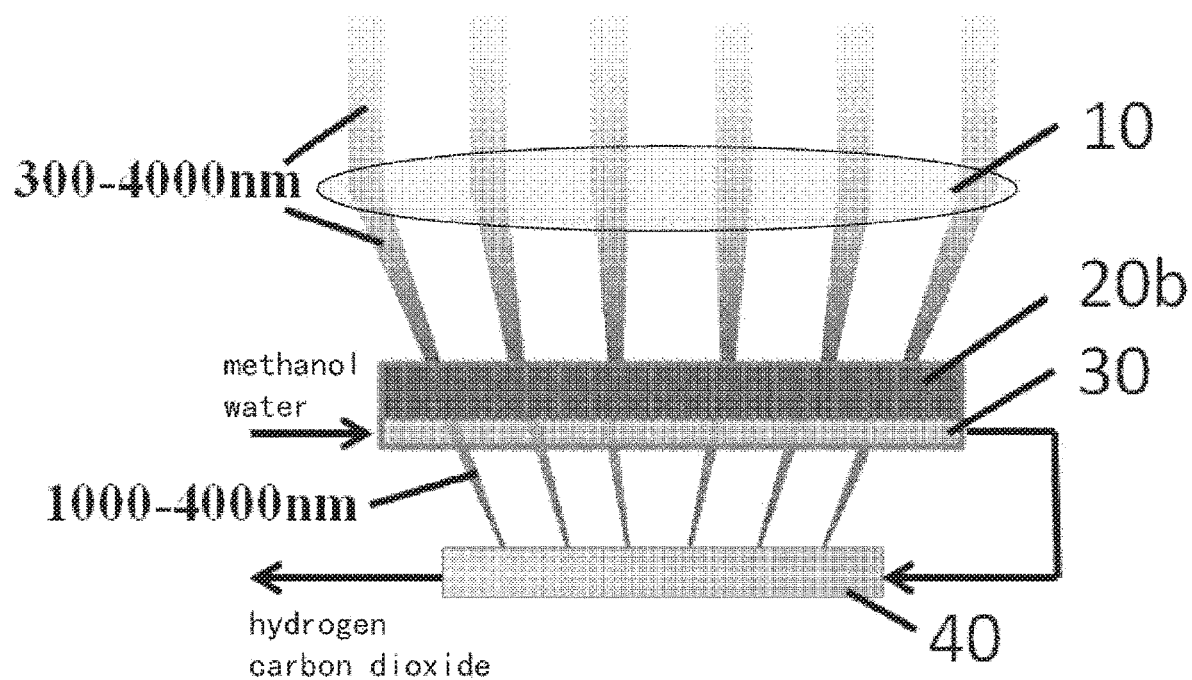
FIG. 2 is a structural schematic view of a transmissive photovoltaic-photothermal reaction complementary full-spectrum solar utilization system based on transmissive photovoltaic cell according to a second embodiment of the present invention.

Example Two: Transmissive Photovoltaic-Photothermal Reaction Complementary Full-Spectrum Solar Utilization System The second exemplary embodiment of the present invention provides a transmissive photovoltaic-photothermal reaction complementary full-spectrum solar utilization system based on transmissive photovoltaic cell. As shown in FIG. 2, this embodiment differs from the first embodiment in the reactants, the chemical reaction used, the transmissive photovoltaic cell 22b and the newly added waveband photothermal reactor 40.

In this embodiment, the reactants used are methanol and steam, and the chemical reaction is a methanol water steam reforming reaction.

In the present embodiment, the transmissive photovoltaic cell 20b has a light transmittance of more than 0 and less than 1. The transmissive photovoltaic cell 20b can only absorb a portion of the available short-wave solar energy (such as 300 nm to 1000 nm). Long-wave solar energy (such as 1000 nm to 4000 nm) is transmitted through the photovoltaic cell 20b and continues to be transmitted in the form of light wave so that the waveband of solar energy that cannot be utilized by the photovoltaic cell is prevented from being converted into a low energy-level thermal energy. A low operating temperature of photovoltaic cell is ensured while the high energy-level chemical energy can be obtained without the use of frequency splitter, providing a good concept for the full spectrum solar photovoltaic photothermal comprehensive utilization.

Referring to FIG. 2, the waveband photothermal reactor 40 is disposed at a location where a designated waveband of sunlight can be received and transmitted through the waveband thermal reactor 30. The inlet of the waveband photothermal reactor 40 is connected to the outlet of the raw material flow channel of the waveband thermal reactor 30 and an outlet thereof is connected to a product storage tank.

It should be noted that the waveband thermal reactor 30 and the waveband photothermal reactor 40 are not in contact with each other in order to avoid solid heat transfer therebetween. The separation distance depends on the size of the system. Further, a vacuum isolation technique may be employed between the waveband thermal reactor 30 and the waveband photothermal reactor 40 to mitigate convective heat transfer therebetween.

At the same time, it should be noted that the waveband thermal reactor can only perform a preheating of the raw materials at a low temperature inside the reactor 30. The preheating of the raw material at a high temperature and chemical reaction of the raw materials are carried out in the waveband photothermal reactor 40. Thus, the chemical reaction temperature will be no longer limited by the operating temperature of the photovoltaic cell and the chemical reaction can be extensively chosen.

In the present embodiment, the sunlight is concentrated to a surface of the transmissive photovoltaic cell 20b by the full spectrum concentrating device 10. The short-wavelength sunlight is absorbed by the transmissive photovoltaic cell 20b. A portion of the short-wavelength sunlight is converted into electric energy, and the remaining portion is converted into a waveband residual heat. The residual heat is used by the waveband thermal reactor 30 to preheat methanol and steam. The long-wavelength sunlight is transmitted through the transmissive photovoltaic cell 20b and the waveband thermal reactor 30 and concentrated to the waveband photothermal reactor 40. The methanol and the water undergo a reforming reaction in the waveband photothermal reactor 40 to produce hydrogen, carbon monoxide and carbon dioxide. The short-wavelength residual heat and the long-wavelength solar energy are converted into a high energy-level chemical energy stored in hydrogen and carbon monoxide (fuel). The hydrogen and the carbon monoxide are separated and purified as the final products.

For the purpose of brief explanation, any description on the technical feature in the first embodiment described above that is appropriate for the second embodiment will be incorporated herein and the similar description will not be repeated.

Example Three: Reflective Photovoltaic-Photothermal Reaction Complementary Full-Spectrum Solar Utilization System For the full-spectrum solar utilization system in the second embodiment, since the sunlight is required to be transmitted through the waveband thermal reactor 30, the waveband thermal reactor 30 should be transmissive for such waveband sunlight, decreasing the selection range of the waveband thermal reactor 30 and of the fluid therein. If a reflective film is provided between the transmissive photovoltaic cell 20b and the waveband thermal reactor 30, as described in the present embodiment, the above-described problem can be avoided.

Figure 3:
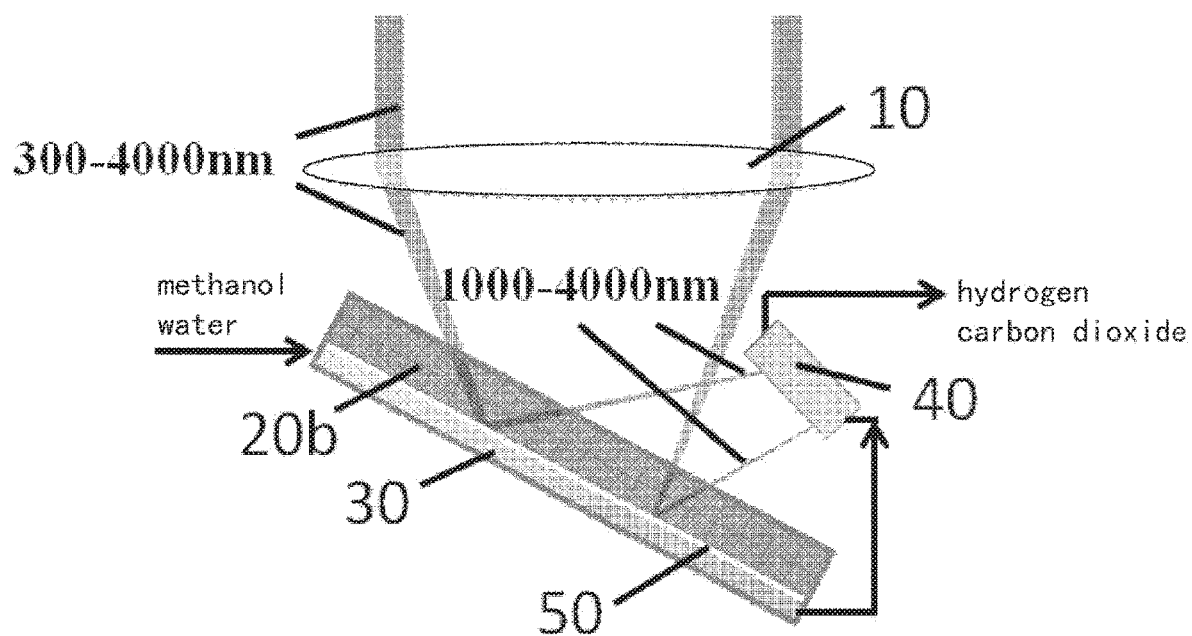
FIG. 3 is a structural schematic view of a reflective photovoltaic-photothermal reaction complementary full-spectrum solar utilization system based on transmissive photovoltaic cell according to a third embodiment of the present invention.

The third exemplary embodiment of the present invention further provides a reflective photovoltaic-photothermal reaction complementary full-spectrum solar utilization system based on transmissive photovoltaic cell. As shown in FIG. 3, the present embodiment differs from the second embodiment in that a reflective film 50 is provided between the transmissive photovoltaic cell 20b and the waveband-shaped thermal reactor 30. The sunlight transmitted through the photovoltaic cell 20b is reflected by the reflective film 50, transmitted through the photovoltaic cell 20b again and concentrated to the waveband photothermal reactor 40.

In the present embodiment, a surface of the reflective film 50 that faces towards the sunlight is a flat surface. In fact, the surface of the reflective film 50 that faces the sunlight may be a flat surface, a curved surface, or a combination thereof.

In this embodiment, an angle at which the reflecting film 50 is inclined with respect to an incident direction of the sunlight is adjustable so as to achieve the purpose of adjusting the optical path. In particular, the sunlight between the full spectrum concentrating device 10 and the transmissive photovoltaic cell 20b is prevented from being blocked by the waveband photothermal reactor 40.

It can be seen that the reflective photovoltaic-photothermal reaction complementary full-spectrum solar utilization system according to the present embodiment can prevent the sunlight from being transmitted through the transmissive waveband thermal reactor 30, so that the design of the waveband thermal reactor 30 is more flexible and so that the chemical reaction applicable in the system is more extensive.

Various embodiments of the present invention have been described in detail with reference to the accompanying drawings. From the above description, one skilled in the art should have a clear understanding on the photovoltaic-photothermal reaction complementary full-spectrum solar utilization system according to the present disclosure.

It should be noted that implementations not shown or described in the drawings or the specification are those that are known to a person skilled in the art and will not be described in detail. In addition, the above-described definitions to the various elements are not limited to the specific structures, shapes or means mentioned in the embodiments, and can be simply changed or replaced by those skilled in the art. For example, (1) the parameters of specific values in the present application are respective examples, but they are not necessary to be equal to the respective values and may be approximate to the respective values within an acceptable tolerance or design constraint;

(2) the directional terms mentioned in the embodiments, such as "upper", "lower", "front", "rear", "left", "right", are only directions with reference to the drawings and are not intended to limit the scope of the present application;

(3) The embodiments described above may be used in combination with each other or with other embodiments based on design and reliability considerations, that is, the technical features in the different embodiments may be freely combined to form more embodiments.

In summary, in the photovoltaic-photothermal reaction complementary full-spectrum solar utilization system of the present application, according to the different responses of the photovoltaic cell and the photothermal reaction to the solar spectrum, the full spectrum efficient utilization of the solar energy is mainly enabled by the combination and utilization of different energy forms, such as solar photovoltaic and thermochemical forms. The low energy-level waveband residual heat and the long-wavelength solar energy are converted into the high energy-level chemical energy while ensuring the high operating efficiency of the photovoltaic cell at low temperature without the use of a frequency splitter, achieving an efficient utilization of solar energy and promoting the output stability of electric energy in the system, which carries a high significance to the comprehensive utilization of solar energy.

The purpose, the technical solution and the advantages of the disclosure have been described in detail with reference to specific embodiments thereof. It should be understood that the above description only relates to particular embodiments but is not intended to restrict the present invention. Any modifications, equivalent replacements, improvements etc. within the spirits and principles of the present application shall all be included within the scope of the present invention.

What is claimed is:
1. A photovoltaic-photothermal reaction complementary full-spectrum solar energy utilization system, comprising:
a waveband thermal reactor having a reactant flow channel and a reaction chamber therein, a photovoltaic cell attached to a surface of the waveband thermal reactor, and a full spectrum concentrating device configured to concentrate full spectrum sunlight to a surface of the photovoltaic cell, wherein the full spectrum concentrating device concentrates the full spectrum sunlight to an upper surface of the photovoltaic cell, wherein a first portion of solar energy is converted into electric energy and a second portion of the solar energy is converted into thermal energy, and wherein the thermal energy is utilized by the waveband thermal reactor to preheat reactant(s) in the reaction chamber and to cause a portion of the reactant(s) to undergo an endothermic chemical reaction such that the thermal energy is stored as chemical energy, wherein the photovoltaic cell is a transmissive photovoltaic cell having a light transmittance of more than 0 and less than 1, wherein the full-spectrum solar energy utilization system further comprises a waveband photothermal reactor having an inlet connected to an outlet of the reactant flow channel of the waveband thermal reactor to receive the reactant(s) and/or reaction product(s) flowing out of the reactant flow channel;

wherein the full spectrum sunlight is directed on the transmissive photovoltaic cell; and wherein a first portion of the full spectrum sunlight is absorbed by the transmissive photovoltaic cell and a second portion of the full spectrum sunlight is transmitted through the transmissive photovoltaic cell and projected onto the waveband photothermal reactor to heat reactant(s) therein such that the reactant(s) undergo(es) the endothermic chemical reaction such that the thermal energy is stored as the chemical energy.

2. The full-spectrum solar energy utilization system according to claim 1, wherein the first portion of the full spectrum sunlight absorbed by the transmissive photovoltaic cell is a short-wavelength sunlight having a wavelength of 300 nm to 1000 nm, and the second portion of the full spectrum sunlight is a long-wavelength sunlight having a wavelength of 1000 nm to 4000 nm.

3. The full-spectrum solar energy utilization system according to claim 1, wherein the waveband thermal reactor is at least partly transmissive and the waveband photothermal reactor is arranged at a position where the second portion of the full spectrum sunlight transmitted through the waveband thermal reactor is receivable; and wherein the full spectrum sunlight is directed on the photovoltaic cell, and the second portion of the full spectrum sunlight is transmitted through the photovoltaic cell and the waveband thermal reactor and projected onto the waveband photothermal reactor.

4. The full-spectrum solar energy utilization system according to claim 3, wherein the waveband thermal reactor and the waveband photothermal reactor are prevented from being in contact with each other to reduce heat transfer therebetween.

5. The full-spectrum solar energy utilization system according to claim 4, wherein the waveband thermal reactor is vacuum-isolated from the waveband photothermal reactor to reduce heat radiation therebetween.

6. The full-spectrum solar energy utilization system according to claim 1, wherein the full spectrum concentrating device is one of a trough solar concentrating device, a Fresnel solar concentrating device, a compound parabolic solar concentrating device, a tower solar concentrating device and a disc solar concentrating device, or a combination thereof.

7. The full-spectrum solar energy utilization system according to claim 1, wherein the reactant is methanol, and the endothermic chemical reaction is a methanol decomposition reaction; or wherein the reactant is dimethyl ether, and the endothermic chemical reaction is a dimethyl ether decomposition reaction; or wherein the reactants are methanol and steam, and the endothermic chemical reaction is a methanol steam reforming reaction; or wherein the reactants are dimethyl ether and steam, and the endothermic chemical reaction is a dimethyl ether steam reforming reaction; or wherein the reactants are ethanol and steam, and the endothermic chemical reaction is an ethanol steam reforming reaction; or wherein the reactants are methane and steam, and the endothermic chemical reaction is a methane steam reforming reaction; or wherein the reactants are methane and carbon dioxide, and the endothermic chemical reaction is a methane carbon dioxide reforming reaction; or wherein the reactant is steam, and the endothermic reaction is a water decomposition reaction; or wherein the reactant is carbon dioxide, and the endothermic reaction is a carbon dioxide decomposition reaction.

8. The full-spectrum solar energy utilization system according to claim 1, further comprising:

a power generation device connected to an outlet of the reactant flow channel of the waveband thermal reactor to do work and/or generate electricity using the reactant(s) or product(s) produced after the endothermic chemical reaction of the reactant(s).

9. The full-spectrum solar energy utilization system according to claim 8, wherein the power generation device is one or more of a gas-steam combined cycle power generation system, an internal combustion engine power generation system, and a fuel cell power generation system.

10. The full-spectrum solar energy utilization system according to claim 6, wherein the first portion of the full spectrum sunlight absorbed by the transmissive photovoltaic cell is a short-wavelength sunlight having a wavelength of 300 nm to 1000 nm, and the second portion of the full spectrum sunlight is a long-wavelength sunlight having a wavelength of 1000 nm to 4000 nm.

11. The full-spectrum solar energy utilization system according to claim 6, wherein the waveband thermal reactor is at least partly transmissive and the waveband photothermal reactor is arranged at a position where the second portion of the full spectrum sunlight transmitted through the waveband thermal reactor is receivable; and wherein the full spectrum sunlight is directed on the photovoltaic cell, and the second portion of the full spectrum sunlight is transmitted through the photovoltaic cell and the waveband thermal reactor and projected onto the waveband photothermal reactor.

12. The full-spectrum solar energy utilization system according to claim 11,
wherein the waveband thermal reactor and the waveband photothermal reactor are prevented from being in contact with each other to reduce heat transfer therebetween.

13. The full-spectrum solar energy utilization system according to claim 12,
wherein the waveband thermal reactor is vacuum-isolated from the waveband photothermal reactor to reduce heat radiation therebetween.

\* \* \* \* \*